(12) United States Patent
Morris et al.

(10) Patent No.: US 8,318,595 B2
(45) Date of Patent: Nov. 27, 2012

(54) SELF-ASSEMBLED ELECTRICAL CONTACTS

(75) Inventors: Christopher J. Morris, Silver Spring, MD (US); Mandan Dubey, South River, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 406 days.

(21) Appl. No.: 12/625,189

(22) Filed: Nov. 24, 2009

(65) Prior Publication Data

US 2010/0139954 A1    Jun. 10, 2010

(51) Int. Cl.
*H01L 21/44* (2006.01)
(52) U.S. Cl. .................. 438/613; 257/E23.021
(58) Field of Classification Search ............ 438/613, 438/614; 257/E23.021
See application file for complete search history.

(56) References Cited

U.S. PATENT DOCUMENTS 7,754,529 B2 * 7/2010 Tomita et al. ............... 438/108

* cited by examiner

*Primary Examiner* — Jenny L Wagner
(74) *Attorney, Agent, or Firm* — Alan I. Kalb (57) ABSTRACT

Self-assembling microscale electrical and mechanical connections includes a part binding site and a part electrical binding site; and a template binding site comprising a template electrical conductor layer; a metallization layer on the template electrical conductor layer; a bump structure comprising a solder alloy positioned on the metallization layer, wherein the solder alloy is liquefied to allow the bump structure to self-assemble and align with the part electrical binding site using capillary forces, and wherein the solder alloy only liquefies at a temperature above that at which the self-assembly and alignment is performed; and a fluid on the template electrical conductor layer, wherein the fluid comprises a melting point lower than that of the solder alloy, wherein the fluid binds with the part binding site.

4 Claims, 10 Drawing Sheets

(Prior Art)

SELF-ASSEMBLED ELECTRICAL CONTACTS

GOVERNMENT INTEREST

The embodiments herein may be manufactured, used, and/or licensed by or for the United States Government without the payment of royalties thereon.

BACKGROUND

1. Technical Field

The embodiments herein generally relate to microscale manufacturing techniques, and, more particularly, to microscale manufacturing techniques for electrical and mechanical connections.

2. Description of the Related Art

The assembly of devices from different materials and/or fabrication processes is a fundamental requirement of any modern system manufacturing procedure. Such assembly is often performed at the device level. For example, a printed circuit board is a system platform which electrically connects a number of individual devices, including resistors, capacitors, inductors, sensors, or integrated circuit (IC) chips. Each of these devices comes from a unique fabrication process, and each device size is constrained in part by the process used to assemble these devices onto the printed circuit board. In addition to the printed circuit board, system platforms include flat or flexible panel displays, bio-compatible medical devices, smart cards, and many other systems which integrate conventional ICs with unconventional substrates.

Modern system integration methods typically use manual or robotic "pick-and-place" techniques. However, below a certain component size scale, these techniques typically cannot handle and deterministically place components with reasonable efficiency and cost. The smallest capacitor package which a modern robotic pick-and-place machine is specified to handle is approximately 300 µm by 600 µm, and suggests that the difficulty of handling even smaller devices would increase beyond a cost-effective level. Modern IC and MEMS manufacturing processes produce devices much smaller than 300 µm, but current assembly methods typically cannot handle such small, individual devices. Therefore, there is a need for cost effective methods of component assembly in the size scale below 300-600 µm.

One method for assembling small devices is to effectively employ similarly-small pick-and-place machines. However, a limitation with such methods is that other forces can overcome the inertial or gravitational forces required to release parts at the desired stage in a pick and place process. These forces contribute to an observed stiction phenomenon. A further limitation is that the deterministic handling of parts becomes infeasible as the number of parts increases, because of the serial nature of such methods.

Self-assembly is an attractive alternative manufacturing paradigm for continued miniaturization and increased functional microsystem integration. A viable self-assembly packaging and integration process requires both assembly and alignment of individual parts to any desired binding sites, as well as electrical and mechanical connections to these binding sites. Furthermore, these processes must be cost-effective, and scalable in terms of numbers of parts assembled and in terms of part size.

One approach to self-assembly is based on magnetic forces where templates are composed of alternating layers of magnetized and non-magnetized material to form a laminated structure with an array of magnetic regions. Components are vibrated and trapped by the magnets to form a matching array. However, a limitation exists with the use of a laminated structure, in that the application of this method to large numbers of assembly sites would be infeasible. Another limitation is that strong magnetic fields remain permanently in the vicinity of each part following assembly, which would affect the electromagnetic characteristics of any device and may be incompatible with many device technologies. A further limitation is that additional process steps are required to form permanent mechanical and electrical connections, which increase cost.

A related approach utilizes magnetized or electrified binding sites using two-dimensional, planar fabrication methods. Such an approach overcomes the limitation associated with laminated structures, and through the use of electrically active structures as opposed to passive, permanent electrets or magnets, the approach also overcomes the limitation of permanent electromagnetic fields in the vicinity of each part. However, the limitation remains of requiring additional process steps to form permanent mechanical and electrical connections, which increases cost.

Another approach involves fluidic self-assembly where individually shaped micrometer-sized parts are integrated into correspondingly shaped recesses on a substrate using a liquid medium, or carrier fluid, for transport. The key features of the approach are that gravitational and fluidic forces guide parts into the desired wells, and each part has a characteristic trapezoidal shape such that it only fits into its well in the desired orientation. Enhancements to fluidic self-assembly include different-shaped wells for self-selecting different part shapes, and the specific use of a gas as the carrier fluid. A limitation with these methods is only gravity will keep the parts in desired wells following assembly, and therefore the parts may disengage from the wells upon further handling. The same limitation also exists in that post processes are required to form permanent mechanical and electrical connections, which is an example of further handling.

In other approaches related to fluidic-assembly, a template may contain specific electrical conductor patterns, such that when electrically charged by an external source, local electric or magnetic fields help guide and trap parts at the desired locations. Limitations with these approaches include high costs associated with the difficulty of providing temporary electrical connections to addressable electrode structures on the template, where the template is typically submerged in a fluid containing the parts to be assembled. The same limitation also exists in that post processes are required to form permanent mechanical and electrical connections.

One way to overcome some post-processing limitations is to take advantage of surface energy effects, such as hydrophobic or hydrophilic interactions. For example, a substrate can be chemically treated to create regions with a hydrophilic or hydrophobic nature. By also treating parts with complementary hydrophobic or hydrophilic surface treatments, hydrophobic parts can be made to adhere only to a hydrophobic template region, and similar effects can be used with hydrophilic parts and regions. Although any hydrophobic or hydrophilic interactions disappear once the surrounding fluid is removed, hydrophobic and hydrophilic effects may be extended through the use of capillary forces. The effects of capillary forces may be made into permanent mechanical bonds via heating a cross-linkable polymer, or through the contact hardening of cyanoacrylate adhesives. One way to control the assembly at particular template locations is by the use of a carrier fluid which increases its viscosity upon local heating. This viscosity increase can "screen" parts from assembling at particular sites while other sites remain available. However, in all of these approaches, a limitation remains in that further processing is needed to make electrical connections.

An example of further processing is the use of an electrolyte carrier fluid for subsequent electroplating. However, this method requires the attachment of temporary electrical connections to addressable electrode structures on the template, which may increase cost and complexity. Another way to form electrical connections directly as part of a fluidic self-assembly process is to take advantage of capillary forces from a molten alloy or solder. This idea has been explored with millimeter to centimeter scale parts, and more recently with micrometer-scale parts, and in conjunction with the complimentary shaped wells of a fluidic self-assembly process. In each of these examples, a single alloy is used for both mechanical assembly and electrical connections, mandating the use of large electrical contacts and/or alloys which melt at near room temperature. The reason is that comparatively long times are required for stochastic self-assembly processes to reach desirable yields, and high-temperature fluid flux environments cause excessive molten alloy degradation and intermetallic growth when the contact size is too small. The reported electrical conductance per unit area of these contacts is 1.5 to 2.0 m$\Omega^{-1}$ cm$^{-2}$, which are over three orders of magnitude lower than macroscopically-formed molten alloy contacts, indicating the level to which the contacts can degrade. Accordingly, there is clearly a need to improve the state of the art in molten-alloy based self-assembled electrical contacts.

SUMMARY

In view of the foregoing, an embodiment herein provides a device that is millimeter-sized or smaller, manufactured from at least two parts, with at least one part comprising a substrate; and a plurality of different liquids patterned on the substrate, wherein at least one of the liquids provides self-assembly and alignment of the part using capillary forces, wherein at least one of the liquids comprises a solder alloy used for electrical connections to the part, and wherein the solder alloy only liquefies at a temperature above that at which the self-assembly and alignment is performed. In one embodiment, if the liquid used for self-assembly and alignment comprises a molten solder alloy, then it has a melting point which is lower than that of the solder alloy used for electrical connections. Additionally, the solder alloy used for electrical connections comprises a plateau solder structure, and wherein the solder alloy may be formed by any of electroplating, electroless plating, screen printing of a solder paste, and may be self-assembled onto binding sites used for subsequent self-assembly of larger parts. Also, the plateau solder structure is used prior to liquefying the solder alloy, and wherein subsequent liquefying of the solder alloy causes an effective height of the plateau solder structure to increase allowing the solder alloy to contact the part. The solder alloy liquefies for only a limited time. Moreover, the solder alloy is solidified after self-assembly and alignment of the part. Preferably, a height of the bump structure prior to liquification is less than a height of the bump structure after solidification.

Another embodiment provides an apparatus comprising a microscale part comprising a part binding site and a part electrical binding site; and a template binding site comprising a template electrical conductor layer; a metallization layer on the template electrical conductor layer; a bump structure comprising a solder alloy positioned on the metallization layer, wherein the solder alloy is liquefied to allow the bump structure to self-assemble and align with the part electrical binding site using capillary forces, and wherein the solder alloy only liquefies at a temperature above that at which the self-assembly and alignment is performed; and a fluid on the template electrical conductor layer, wherein the fluid comprises a melting point lower than that of the solder alloy, wherein the fluid binds with the part binding site.

In one embodiment, the fluid comprises a metal alloy. Preferably, the bump structure forms an electrical connection between the template electrical conductor layer and the part electrical binding site. Furthermore, the solder alloy liquefies for only a limited time. Additionally, the solder alloy comprises a plateau solder structure, and wherein the solder alloy may be formed by any of electroplating, electroless plating, screen printing of a solder paste, and self-assembly onto the part binding site used for subsequent self-assembly of larger parts. Preferably, the plateau solder structure is used prior to liquefying the solder alloy, and wherein liquefying of the solder alloy causes an effective height of the plateau solder structure to increase allowing the solder alloy to contact the microscale part. The apparatus further comprises a template structure adjacent to the template electrical conductor layer; and a base material positioned between the template structure and the fluid. Moreover, the solder alloy is solidified after self-assembly and alignment of the bump structure with the part electrical binding site. Preferably, a height of the bump structure prior to liquification is less than a height of the bump structure after solidification.

Another embodiment provides a method of self-assembling microscale structures, the method comprising providing a microscale part comprising a part binding site and a part electrical binding site; and providing a template binding site comprising a bump structure comprising a solder alloy; and a fluid comprising a melting point lower than that of the solder alloy. The method further comprises liquifying the solder alloy to allow the bump structure to self-assemble and align with the part electrical binding site using capillary forces, and wherein the solder alloy only liquefies at a temperature above that at which the self-assembly and alignment is performed; and solidifying the solder alloy after self-assembly and alignment of the bump structure with the part electrical binding site causing the fluid to bind with the part binding site. Preferably, a height of the bump structure prior to liquification is less than a height of the bump structure after solidification. The fluid may comprise a metal alloy. The solder alloy may be formed by any of electroplating, electroless plating, screen printing of a solder paste, and self-assembly onto the part binding site used for subsequent self-assembly of larger structures.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a technique for forming electrical and mechanical connections via self-assembly without sacrificing the electrical qualities of those connections on microscale-sized parts (e.g., approximately 280 μm). The use of two alloys, or more generally the use of two liquids, where one liquid is a metal alloy, decouples the formation of mechanical and electrical connections. The second alloy is intended specifically for the formation of electrical connections, allowing smaller and higher quality electrical contacts. Referring now to the drawings, and more particularly to FIGS. 1 through 8, where similar reference characters denote corresponding features consistently throughout the figures, there are shown preferred embodiments.

Figure 1:
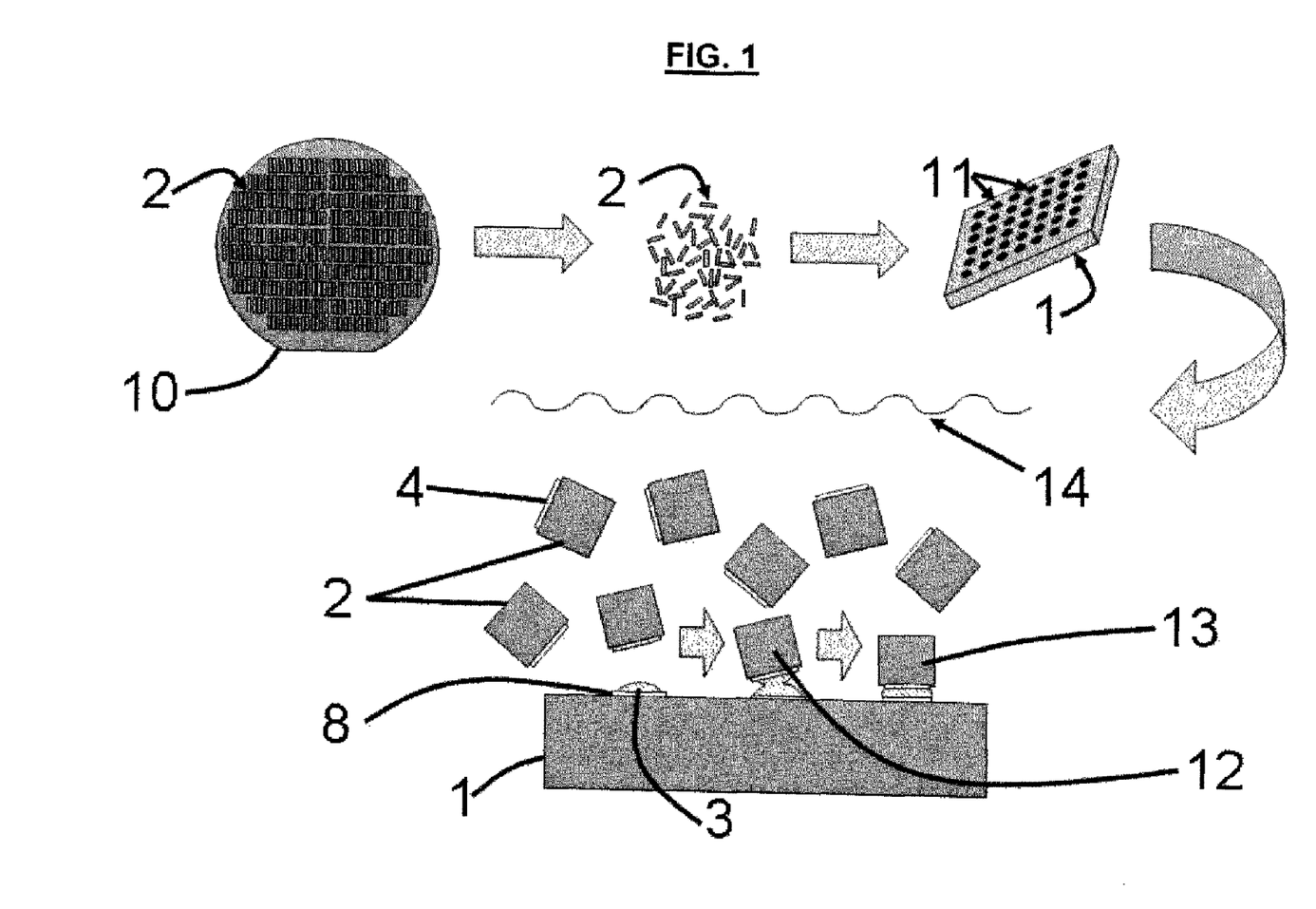
FIG. 1 illustrates a general fluidic self-assembly process according to the embodiments described herein.

FIG. 1 shows a schematic of fully-released micrometer-sized parts 2 from one fabrication process represented by wafer 10, and a process to integrate these parts with a template 1 from a different fabrication process. The template 1 contains a plurality of binding sites 11, with each binding site 11 being defined by a fluid 3 and a base material 8 to which a small region of the fluid 3 is bound. In one example, the fluid 3 comprises a low-melting point metal alloy, and the fluid 14 is heated to above the metal melting point. In another example, the fluid 3 is in liquid form at room temperature and is immiscible in fluid 14. The parts 2 each contain a binding site 4 to which fluid 3 will adhere when binding site 4 and fluid 3 come in contact. When parts 2 are agitated by fluidic or other forces, they move randomly over the template surface and occasionally part binding site 4 contacts a template binding site 11, as depicted by micro-component 12. Capillary forces from fluid 3 then bind and hold the part in place, as depicted by micro-component 13. Due to the large number of parts relative to the number of available template binding sites 11, after a sufficient period of time, each template binding site 11 will be filled with one part 2. The result is a new system with parts 2 successfully integrated onto template 1.

Figure 2:
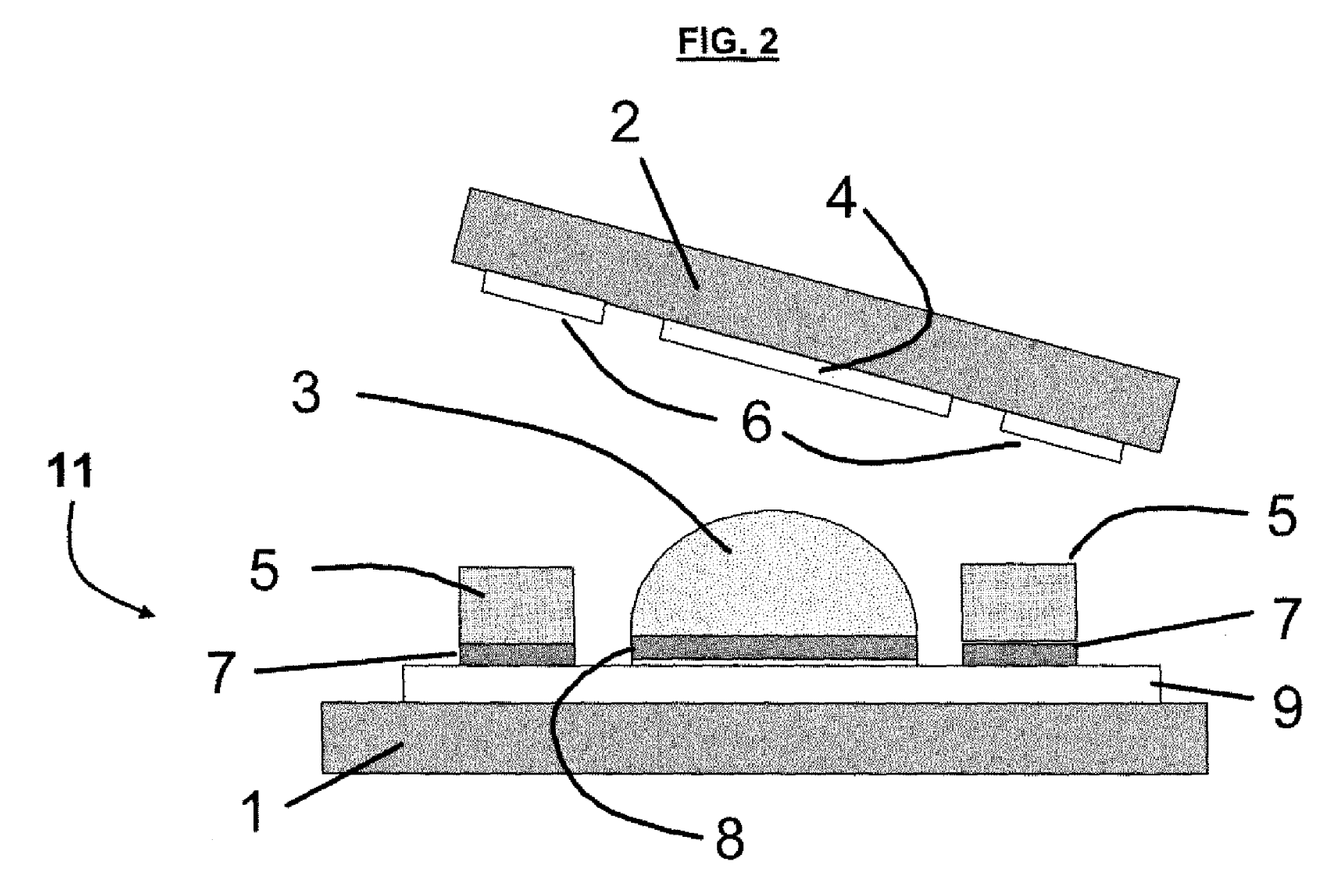
FIG. 2 illustrates a fluidic self-assembly process prior to alignment according to the embodiments described herein.

The embodiments herein provide the incorporation of a second binding site intended specifically for electrical connections. FIG. 2, with reference to FIG. 1, shows the cross section image of one template binding site 11 and a nearby part 2, the template binding site 11 features a fluid 3 and a part binding site 4 intended for the formation of a mechanical connection as before. In addition to fluid 3, a previously-deposited solder pedestal or bump 5 on top of an underbump metallization layer (UBM) 7 is located on the template. The solder bumps 5 are not liquefied and do not participate in this stage of the assembly process, and retain good electrical conduction properties for later use. Fluid 3 may be a low-melting point metal alloy with a melting point that is lower than that of solder alloy 5. Fluid 3 may also be any other liquid which is immiscible with fluid 14.

Figure 3:
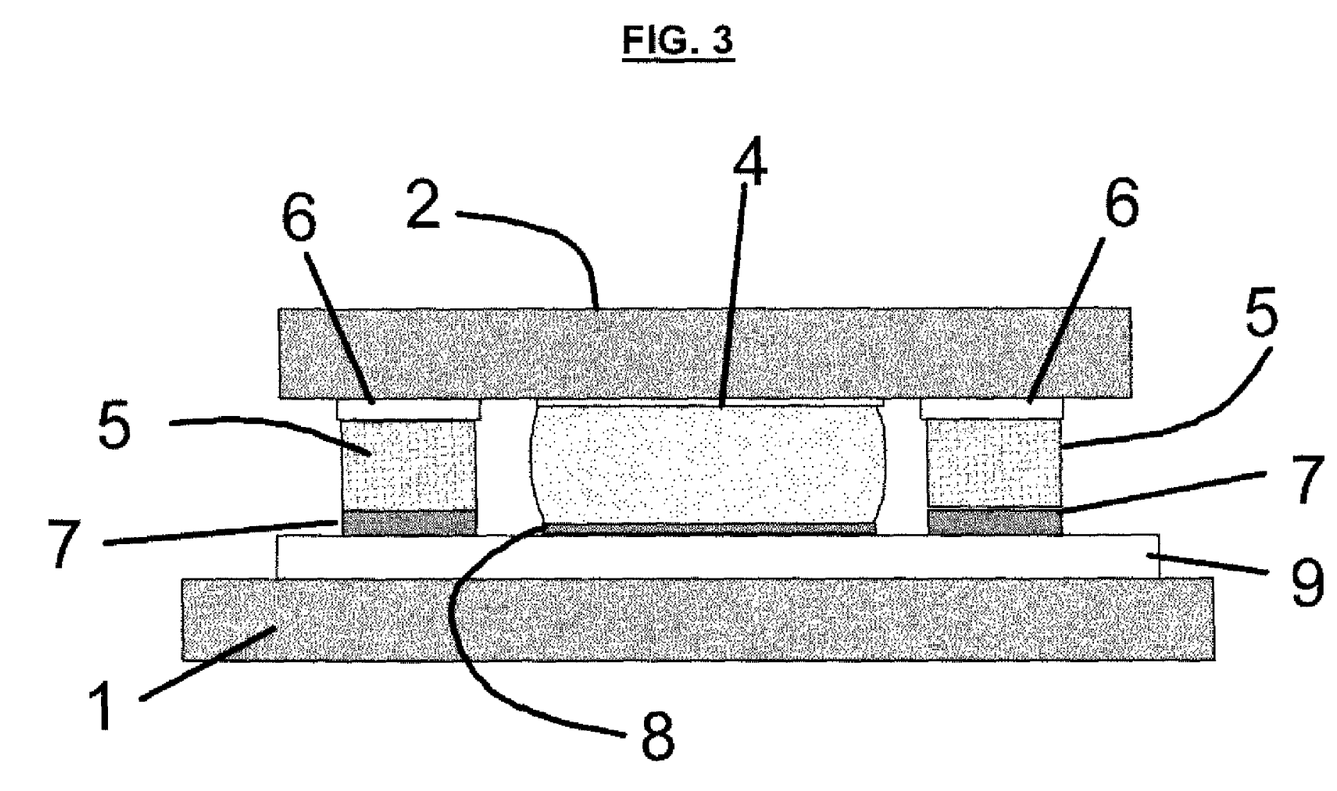
FIG. 3 illustrates a fluidic self-assembly process after alignment according to the embodiments described herein.

As shown in FIG. 3, with reference to FIGS. 1 through 2, once the part 2 has been assembled, the solder bumps 5 align with part electrical binding sites 6. The system is then globally heated above the melting point of solder 5, or locally heated in the regions of solder 5, for example through incorporated micro-scale heaters. The heat is applied just sufficiently long enough to allow the solder 5 to flow and form electrical connections between the template electrical conductor layers 9 and those on the part 6. The formation of electrical connections as a separate process from that of physical assembly avoids problems with excessive solder degradation and intermetallic compound growth in the under bump metal layers 6, 7, and in general achieves much better electrical connections.

Figure 4:
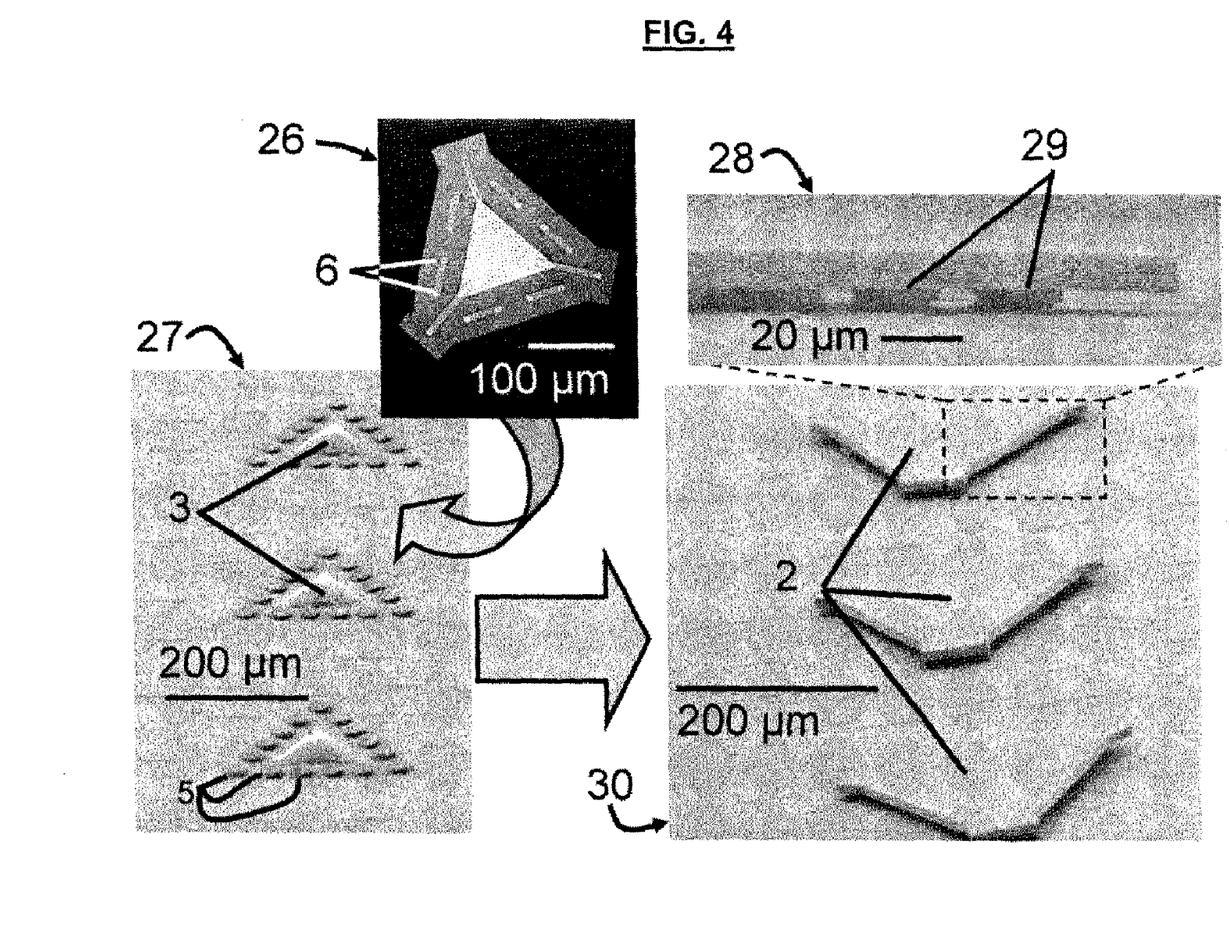
FIG. 4 illustrates a scanning electron microscopy representation of a test part according to the embodiments described herein.

FIG. 4, with reference to FIGS. 1 through 3, depicts a scanning electron microscopy representation illustrating an embodiment herein, with 26 showing a test part shape. The shape of the part shown in 26 is triangular, however the embodiments herein are not restricted to a particular shape or size within a range of approximately 1-10,000 μm. The particular part shown in 26 contains 10 μm diameter electrical binding sites 6, designed to align with the solder bumps 5 in the template image 27. Also shown in the template image 27 are the binding sites 3 containing regions of a solder alloy having a lower melting point than the alloy comprising solder bumps 5. In this particular embodiment, the solder binding sites 3 are composed of an eutectic tin-bismuth alloy melting at approximately 138° C., and the solder bumps 5 are composed of an eutectic tin-lead alloy melting at approximately 183° C. However, the embodiments herein are not restricted to a particular type of alloy used for either the binding sites 3 or the solder bumps 5, nor is there a restriction on whether a molten solder alloy is used for binding sites 3 or if some other liquid is used.

After the parts 2 are self-assembled on the template via capillary forces provided by the liquid binding sites 3, the solder bumps 5 remain in a solid state. Following the initial assembly, and following the formation of electrical connections by heating the template above each solder bump 5 melting point for approximately 30 seconds, a close-up image of three self-assembled parts 2 is shown in 30. In 28, a side image of the electrical contacts 29 is shown. In this example, the connections measured on average 3.9Ω. For the 10 μm diameter contacts 6 on each part, this electrical resistance corresponded to a conductance-per-unit-area of approximately 333 $m\Omega^{-1}$ $cm^{-2}$, which is over 160 times higher than other conventional values of measured, self-assembled electrical contacts. This gain in electrical conductance may be obtained by heating alloy 5 above its melting point for a brief time, which may limit solder degradation and excessive intermetallic compound growth.

Figure 5:
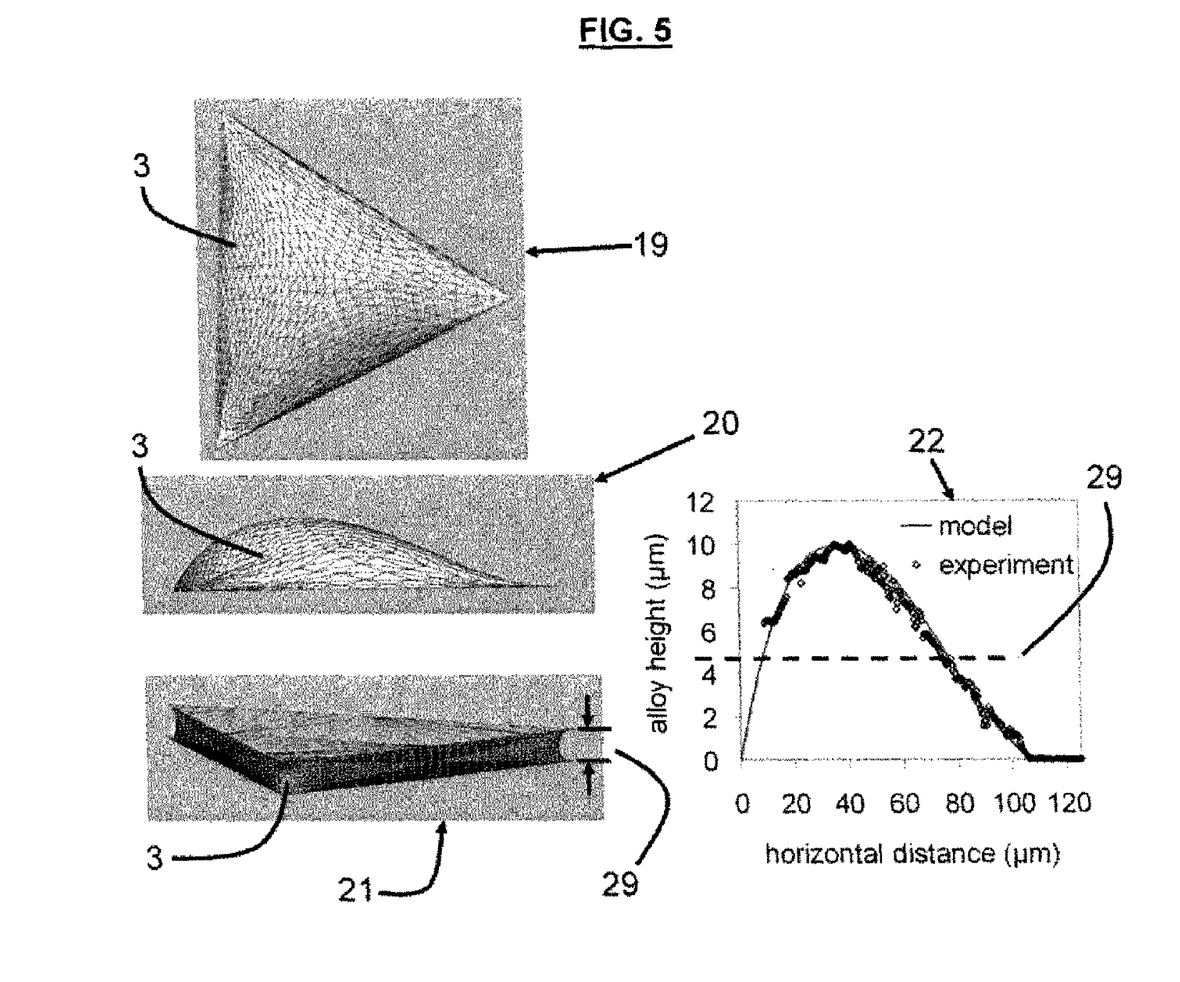
FIG. 5 illustrates a model simulation of a fabricated test part according to the embodiments described herein.

FIGS. 5 though 7 show design considerations when fabricating a template with two different molten alloys. In FIG. 5, with reference to FIGS. 1 through 4, a liquid binding site is modeled using a surface energy minimization code, which predicts the shape of a liquid surface. The triangular base feature 19 in FIG. 5 is of dimensions small enough that gravitational forces are neglected, and the liquid surfaces depicted in FIG. 5 are independent of liquid surface tension, size, or any other liquid property. In 19, a top view of a liquid binding site 3 is shown, and 20 shows a side view of the same liquid binding site. In 22, the shape is compared to experimental data of the height profile of an actual liquid binding site with excellent agreement. In 21, the height 29 of a capillary bond resulting from bringing another wettable surface in contact with liquid 3 is predicted, which corresponds to the dashed line in 22. In other words, a triangular region of liquid will start with the profile shown in 22, but will become the dashed line 29 after the part binds to liquid 3.

Figure 6:
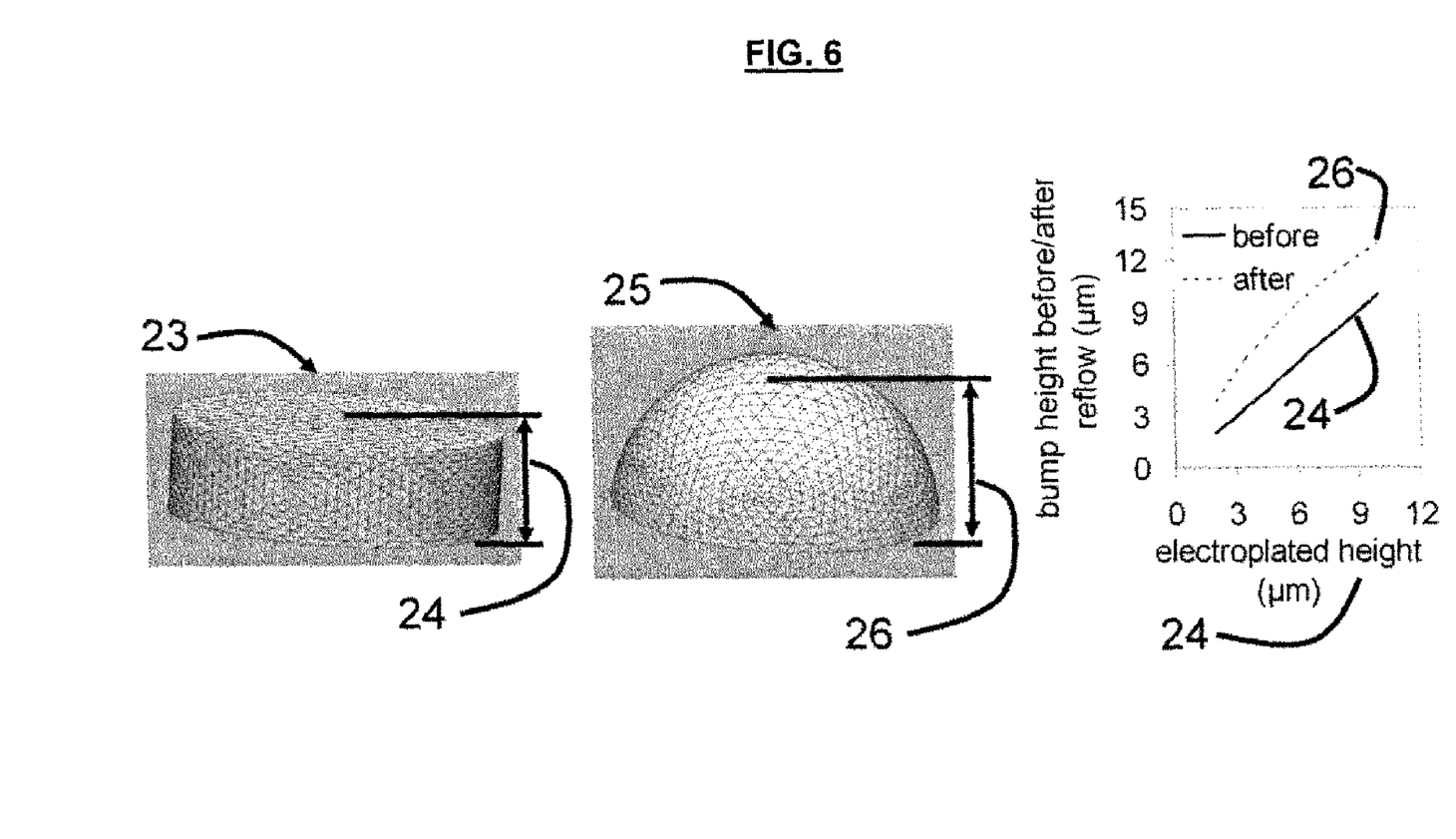
FIG. 6 illustrates the difference in the height of solder bump structures according to the embodiments described herein.
Figure 7:
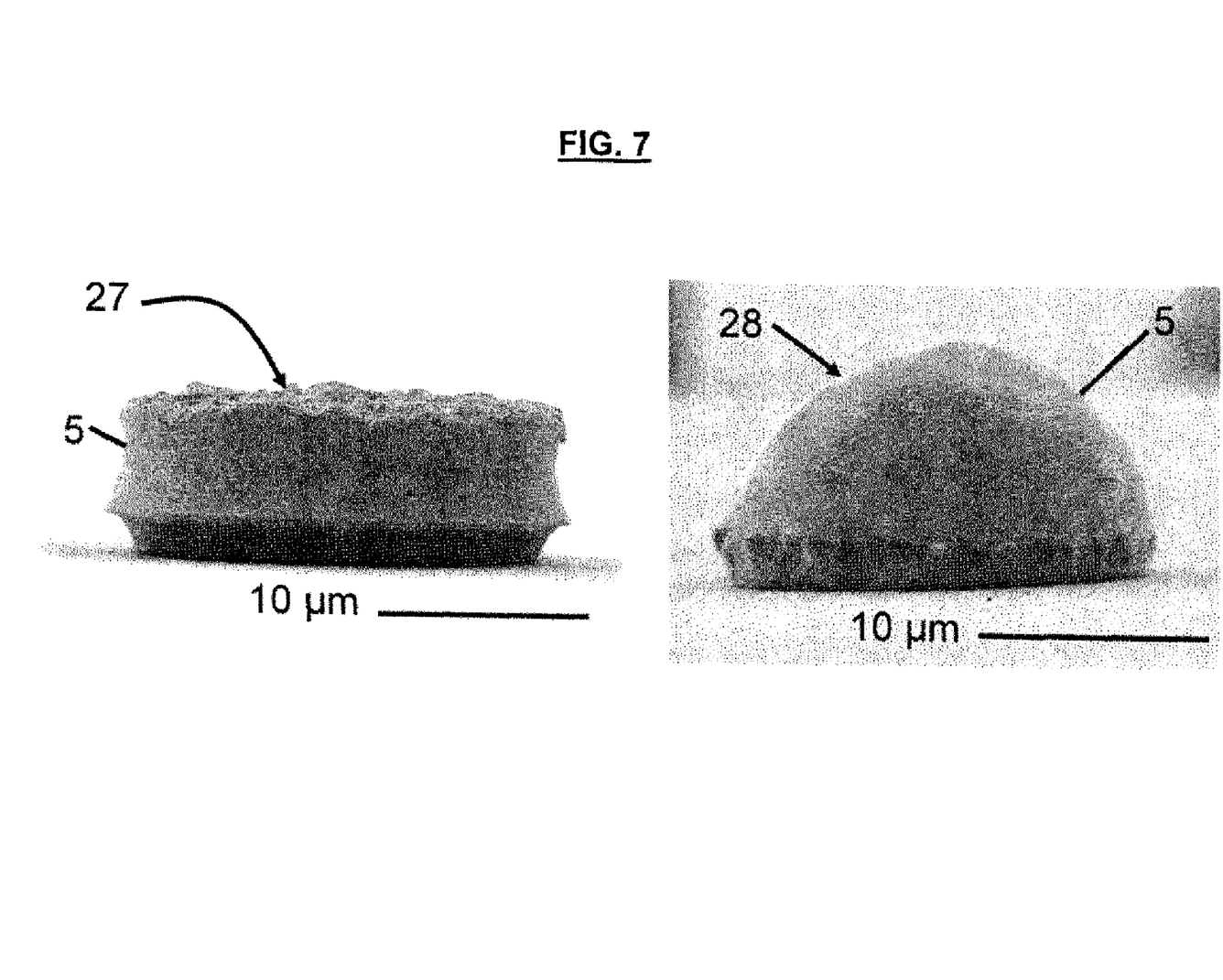
FIG. 7 illustrates scanning electron microscopy representations illustrating the difference in the height of solder bump structures according to the embodiments described herein.

FIG. 6, with reference to FIGS. 1 through 5, shows similar surface profile calculations of an electrical connection solder bump 5. In 23, a modeled electroplated solder pedestal is shown, with height 24. In 25, this pedestal has liquefied to exhibit a new height 26, called the reflow height. The graph shows the predicted reflow height 26 vs. the initial, electroplated height 24, for a 20 μm diameter contact. FIG. 7, with reference to FIGS. 1 through 6, shows side scanning electron microscopy images of two similar solder bumps 5, with object 27 showing the height before reflow and object 28 showing the height following reflow.

A design rule which follows these descriptions is that an electroplated solder bump 5 should initially have a height 24 in FIG. 6 which is lower than the height of liquid 3 in FIG. 5, and preferably lower than the capillary bond height 29 in FIG. 5. After a part assembles and liquid 3 assumes height 29, the reflow height 26 of a solder bump should exceed that of the capillary bond height 29 to ensure contact with the appropriate part binding site.

Figure 8:
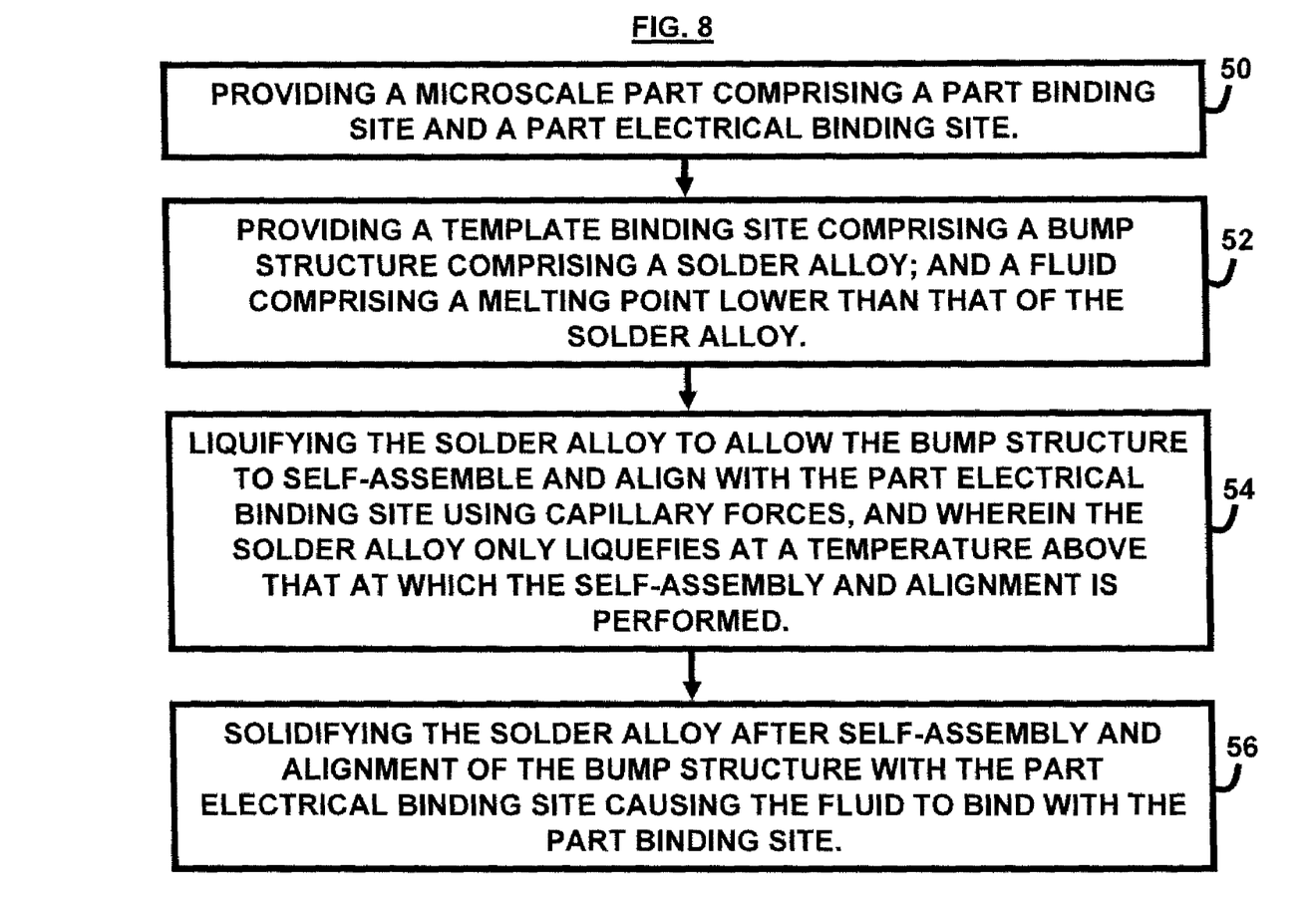
FIG. 8 is a flow diagram illustrating a method according to the embodiments described herein.

FIG. 8, with reference to FIGS. 1 through 7, is a flow diagram illustrating a method of self-assembling microscale structures, the method comprising providing (50) a microscale part 2 comprising a part binding site 4 and a part electrical binding site 6; and providing (52) a template binding site 11 comprising a bump structure 5 comprising a solder alloy; and a fluid 3 comprising a melting point lower than that of the solder alloy. The method further comprises liquifying (54) the solder alloy to allow the bump structure 5 to self-assemble and align with the part electrical binding site 6 using capillary forces, and wherein the solder alloy only liquefies at a temperature above that at which the self-assembly and alignment is performed; and solidifying (56) the solder alloy after self-assembly and alignment of the bump structure 5 with the part electrical binding site 6 causing the fluid 3 to bind with the part binding site 4. Preferably, a height of the bump structure 5 prior to liquification is less than a height of the bump structure 5 after solidification. The fluid 3 may comprise a metal alloy. The solder alloy may be formed by any of electroplating, electroless plating, screen printing of a solder paste, and self-assembly onto the part binding site used for subsequent self-assembly of larger structures.

Figure 9:
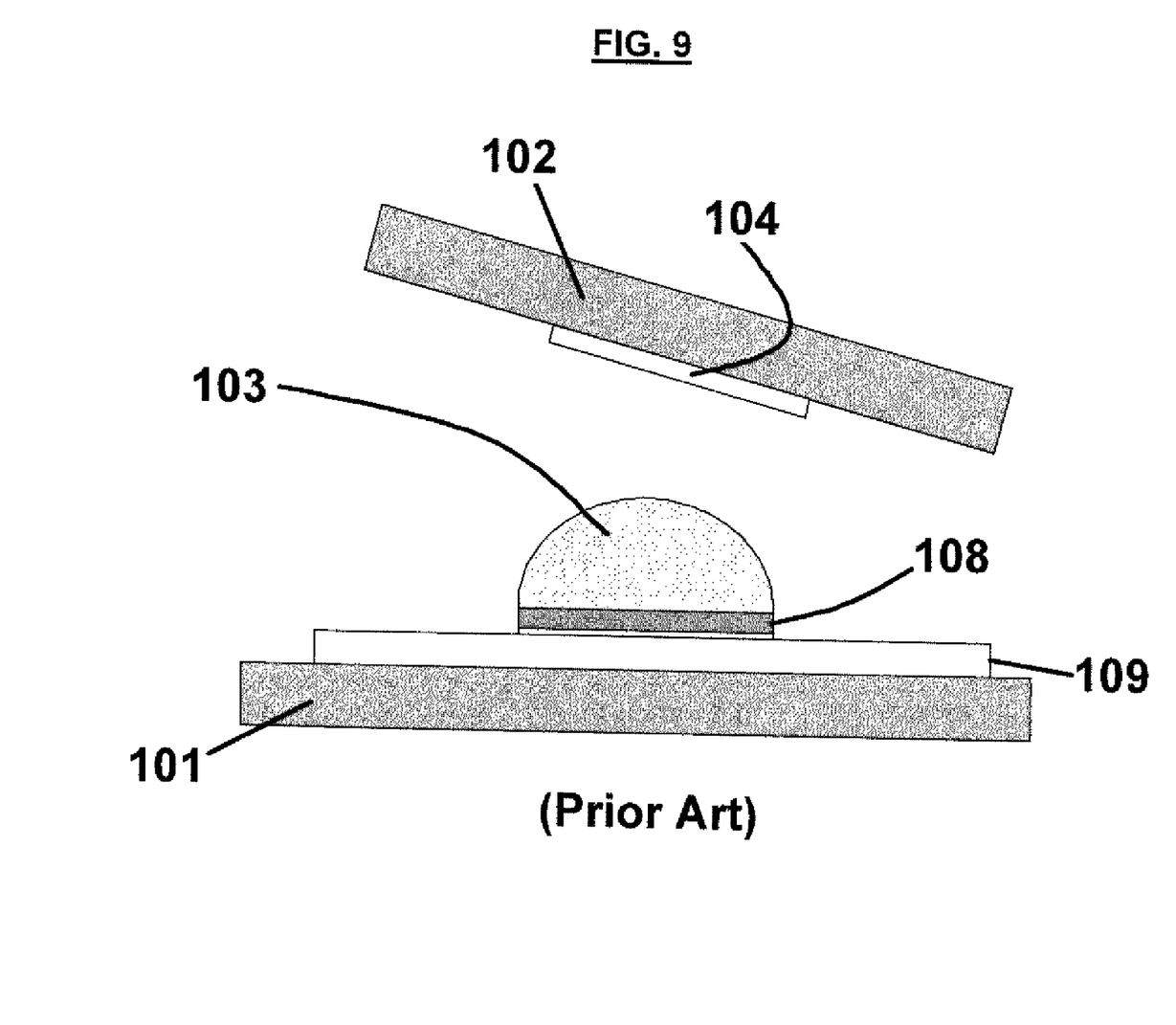
FIG. 9 illustrates a fluidic self-assembly process prior to alignment according to the conventional solutions.
Figure 10:
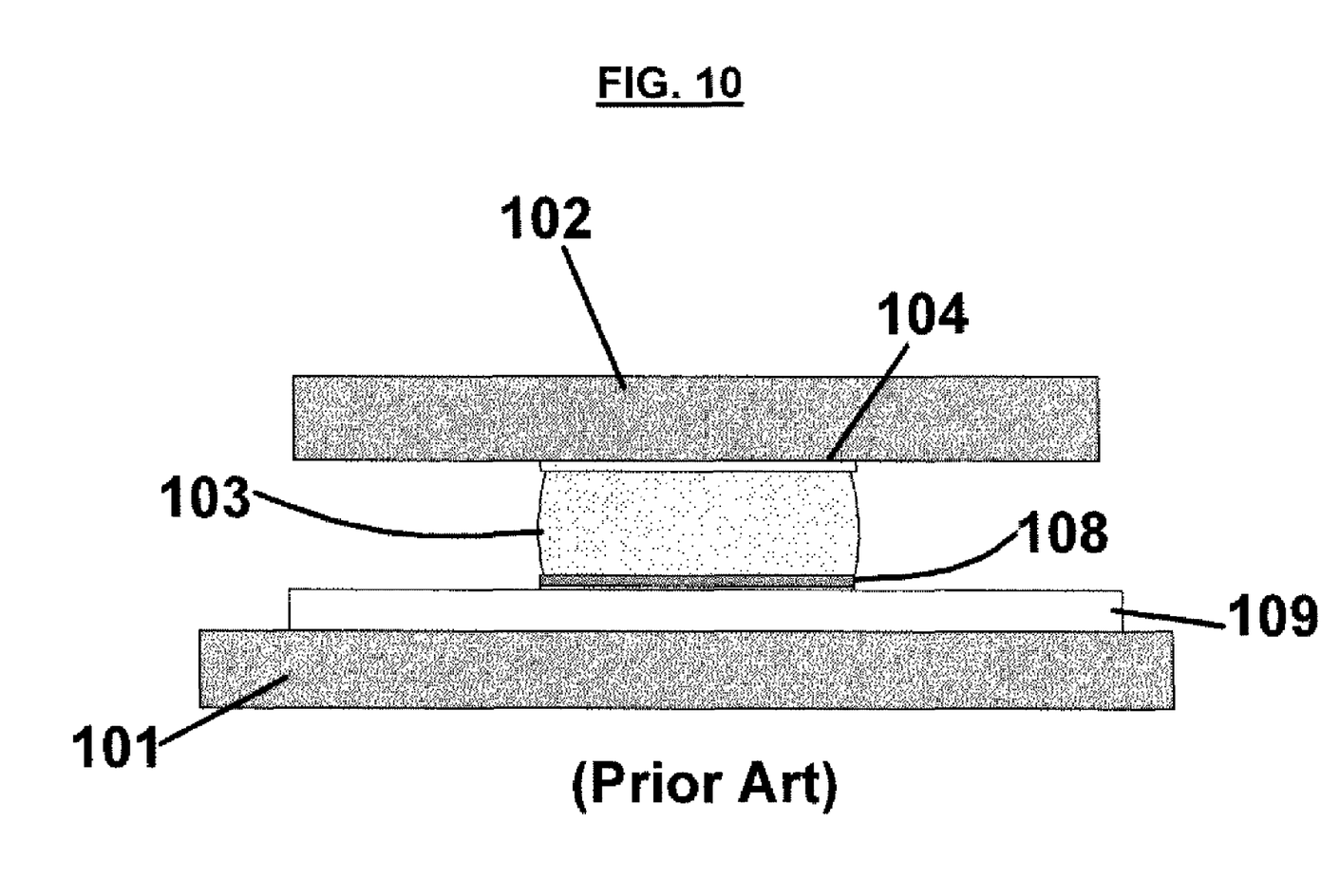
FIG. 10 illustrates a fluidic self-assembly process after alignment according to the conventional solutions.

The embodiments herein improve the state of the art in molten-alloy based self-assembled electrical contacts, with initial results indicating an improvement in electrical conductance by a factor of 160. To illustrate the problem with conventional solutions that the embodiments herein address, and with reference to FIGS. 9 and 10, where FIG. 9 illustrates the pre-assembly configuration, and FIG. 10 illustrates the post-assembly configuration. In FIG. 9, solder alloy 103 is held above its melting temperature for an extended period of time in order for the stochastic self-assembly processes to reach a desirable yield. During this time, alloy 103 remains a liquid and its quality decreases due to the corrosive environment in which it is held in order to insure that the alloy surface is free of metal oxides which otherwise interfere with solder-metal bonds. The quality of the electrical contact between the alloy and the underlying metal layer 108 also decreases due to intermetallic compound (IMC) growth. After a part 102 has been assembled (as shown in FIG. 10) on template 101 comprising template electrical conductor layer 9, alloy 103 remains above its melting temperature to allow other neighboring parts to self-assemble, and alloy 103 continues to degrade along with the alloy-metal connections to metal layers 108 and now the metal layer on the part, 104.

The embodiments herein may be used in a variety of applications including, but not limited to: (i) integration of group III and group IV semiconductors at the device level rather than what is conventionally termed the die level; (ii) formation of large area displays on flexible or other low-cost substrates; (iii) integration of microelectromechanical system (MEMS) devices with complementary metal-oxide-semiconductor (CMOS)-compatible substrates, or with flexible, polymeric, organic, or other unconventional substrates; (iv) integration of electronic, micro-mechanical, or photonic devices on printed circuit boards; (v) implementation of "system-on-chip" designs in a low-cost manner, where the desire to monolithically integrate many types of microelectronic systems on one chip is prohibited by the cost of process changes that would be required to render each fabrication process compatible with all other fabrication processes needed for a particular system. For instance, memory, CMOS digital logic, analog circuitry, solar power collection, and infrared sensing devices are all based on silicon substrate technology, but significant process development would be required to monolithically fabricate a single chip with even two of these process technologies; and (vi) fabrication of three-dimensional, millimeter-scale structures composed of micrometer-scale or smaller components micro-robotics.

The formation of mechanical and electrical connections by self-assembly, as provided by the embodiments herein, allows future miniaturization and increased microsystem integration. Such system integration can be used in nearly every hardware-based industry, ranging from consumer electronics to medical devices to transportation, because it allows more functionality to be integrated into the same package.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of self-assembling microscale structures, said method comprising:

providing a microscale part comprising a mechanical binding site and an electrical binding site;
providing a template comprising:
   a bump structure comprising a solder alloy;
   a fluid having a melting point lower than that of said solder alloy; and
   a carrier fluid medium transporter;
liquefying said carrier fluid medium transporter and lower melting point fluid to allow stochastic capture and self-assembly of said microscale parts from said carrier fluid onto said template and to allow said bump structure to align with said electrical binding site using capillary forces from said carrier fluid, and wherein said solder alloy only liquefies at a temperature above that at which said self-assembly and alignment is performed;
liquefying said solder alloy to form electrical connections with said electrical binding sites; and
solidifying said solder alloy after self-assembly and alignment of said bump structure with said electrical binding sites causing said bump structure solder alloy to bind with said mechanical binding site.

2. The method of claim 1, wherein a height of said carrier fluid medium transporter prior to self-assembly, capture, and binding with said mechanical binding site is greater than the height of said carrier fluid medium transporter after self-assembly, capture and binding with said mechanical binding site; and wherein the height of said bump structure prior to liquification is less than a height of said bump structure after liquification.

3. The method of claim 1, wherein said carrier fluid medium transporter comprises a metal alloy.

4. The method of claim 3, wherein said metal alloy is formed by any of electroplating, electroless plating, screen printing of a solder paste, and self-assembly onto said part binding site used for subsequent self-assembly of larger structures.

\* \* \* \* \*